United States Patent [19]

Beard

[11] Patent Number: 5,796,359
[45] Date of Patent: Aug. 18, 1998

[54] DATA CONVERSION AND PROCESSING SYSTEM

[75] Inventor: Paul Beard, Milpitas, Calif.

[73] Assignee: Norand Corporation, Cedar Rapids, Iowa

[21] Appl. No.: 760,085

[22] Filed: Oct. 25, 1996

Related U.S. Application Data

[60] Provisional application No. 60/007,021 Oct. 25, 1995.
[51] Int. Cl.$^6$ .................................................. H03M 3/02
[52] U.S. Cl. ................................................ 341/143; 341/118
[58] Field of Search ................................ 341/125, 157, 341/163, 118, 143

[56] References Cited

U.S. PATENT DOCUMENTS

| | | | |
|---|---|---|---|
| 4,107,669 | 8/1978 | Tewksbury | 340/347 |
| 4,860,012 | 8/1989 | Rich et al. | 341/143 |
| 4,937,577 | 6/1990 | Rich et al. | 341/143 |
| 5,276,764 | 1/1994 | Dent | 395/2 |
| 5,311,181 | 5/1994 | Ferguson, Jr. et al. | 341/143 |
| 5,548,286 | 8/1996 | Craven | 341/126 |

*Primary Examiner*—Marc S. Hoff
*Attorney, Agent, or Firm*—Akin, Gump, Strauss, Hauer & Feld, L.L.P.

[57] ABSTRACT

A data conversion and processing system (10) includes a comparator (12), data modulation circuitry (24), monitoring circuitry (25) and a feedback filter (30) to provide both data conversion and data processing functions. The comparator (12) receives an analog input signal (22) and an analog feedback signal (32) and produces a comparator output (20). When the analog input signal (22) exceeds the analog feedback signal (32), the comparator (12) produces a logic one and, when not, a logic zero. The data modulation circuitry (24) receives the comparator output (20) and produces a digital feedback signal (28) based upon the comparator output (20). A data processor (102) performs functions of the data modulation circuitry (24) and the monitoring circuitry (25) as well as additional data processing functions. The data processor (102) produces the digital feedback signal (28) via clock generation circuitry (106). Alternatively, a data processor (160) produces transitions of the digital feedback signal (28) via flip-flop decode circuitry (154) and an output flip-flop (156).

20 Claims, 4 Drawing Sheets

5,796,359

DATA CONVERSION AND PROCESSING SYSTEM

CROSS-REFERENCE TO RELATED APPLICATIONS

The present application claims priority pursuant to 35 U.S.C. Sec. 119(e) to U.S. Provisional Application Ser. No. 60/007,021 (Attorney Docket No. DN38131), filed Oct. 25, 1995, which is hereby incorporated herein by reference in its entirety.

BACKGROUND

1. Technical Field

The present invention relates generally to analog-to-digital conversion and data processing and more particularly to a low cost analog to digital converter that converts both direct and alternating analog signals to equivalent digital signals and also performs signal and data processing functions.

2. Related Art

The advent of smaller and more powerful digital electronic circuitry and electronic devices has resulted in dramatic increases in the power and utility of processing information in the digital domain. Such digital information processing is typically performed with a microcontroller or microprocessor in order to achieve greater processing versatility and control. Often, the desired signal processing functions are simply too complex to implement in the analog domain. Consequently, the utilization of microprocessors to perform digital information processing is today so widespread that it is the exception to utilize any other type of information processing equipment.

Naturally occurring information signals are inherently analog in that they are continuously variable physical quantities (e.g. sound intensity, light intensity, battery voltage and voice signals). Mathematically, analog signals exhibit an infinite number of magnitude-scaled values within a given magnitude range. Digital signals, on the other hand, exhibit a finite number of binary-coded values within an equivalent magnitude range. Prior to operating on analog signals in a digital data processing system, it is necessary to convert the analog signals into digital signals with an analog-to-digital converter.

Analog-to-digital conversion techniques are known in the art of data conversion systems. An analog-to-digital (ADC) converter is an electronic circuit that converts a magnitude-scaled analog voltage input signal into a binary-coded digital number output proportional to the analog input. The binary-coded digital number output represents the analog voltage input in further read and processing operations by a processing system. Thus, an ADC serves as the interface between a digital computer and the outside analog world. Further processing of the digital signals may be accomplished with a microprocessor, microcontroller, digital signal processor or other digital circuitry capable of performing desired processing functions on the digital signals.

Because ADCs are required in many products that also have data processing requirements, ADCs are often embedded within the integrated circuitry of processors, i.e. microcontrollers. In these installations, the ADCs increase the cost, size and power consumption of the microcontrollers and limit the types of installations within which the microcontrollers may be used. Alternatively, dedicated ADCs may be installed external to the microcontrollers to reduce the cost, size and power consumption of the microcontrollers.

However, the dedicated ADC circuitry ultimately adds cost to overall product design and requires additional board space in the product to accommodate the external ADC. Further, external ADCs often require critically related components that must be attached to the boards on which the ADCs mount. These components are expensive and require longer signal paths for attachment. However, in any case, the ADC circuitry was discrete from the data processing circuitry of the microcontroller.

Thus, there is a need in the art for a signal conversion and processing system which eliminates the need for an embedded ADC and at the same time eliminates the need for a discrete external ADC.

Further, there exists the need for an ADC which does not require critically related components and which accomplishes analog-to-digital conversion with as few components as possible.

SUMMARY OF THE INVENTION

A data conversion and processing system includes a comparator, data modulation circuitry, monitoring circuitry and a feedback filter to provide both data conversion and data processing functions. The comparator receives an analog input signal and an analog feedback signal and produces a comparator output. When the analog input signal exceeds the analog feedback signal, the comparator produces a logic one and, when not, a logic zero.

The data modulation circuitry receives the comparator output and produces a digital feedback signal based upon the comparator output. In one embodiment, the data modulation circuitry comprises a pulse width modulator that produces a digital feedback signal having pulse widths proportional to the magnitude of the analog input signal. The monitoring circuitry receives the comparator output and/or the digital feedback signal and produces a digital representation of the analog input signal based upon the comparator output. The feedback filter receives the digital feedback signal and produces the analog feedback signal.

In a described embodiment, a data processor performs functions of the data modulation circuitry and the monitoring circuitry as well as additional data processing functions. By placing this functionality in the data processor, components otherwise required for analog to digital data conversion may be omitted. Thus, the system of the present invention provides a lower costs solution to data conversion and data processing than was otherwise available. Furthermore, the data processor may provide additional control in the data conversion process. The data processor may selectively disable operation of the comparator and data modulation circuitry to conserve energy consumption to extend battery life. Further, the data processor may alter sampling intervals and frequencies based upon the immediate requirements posed by the analog input signal.

In one embodiment, the modulation circuitry includes a clock generator that receives the digital representation of the analog input signal from the processor and produces the digital feedback signal based upon the digital representation of the analog input signal. In another embodiment, the processor generates both rising and falling edges of the digital feedback signal via a flip-flop decoding and a flip-flop circuit. In either of these implementations, the processor may vary the frequency of the digital feedback signal to conserve energy and reduce both operating and design costs.

BRIEF DESCRIPTION OF THE DRAWINGS

The numerous objects and advantages of the present invention may be better understood by those skilled in the art by reference to the accompanying figures in which.

DETAILED DESCRIPTION

Figure 1:
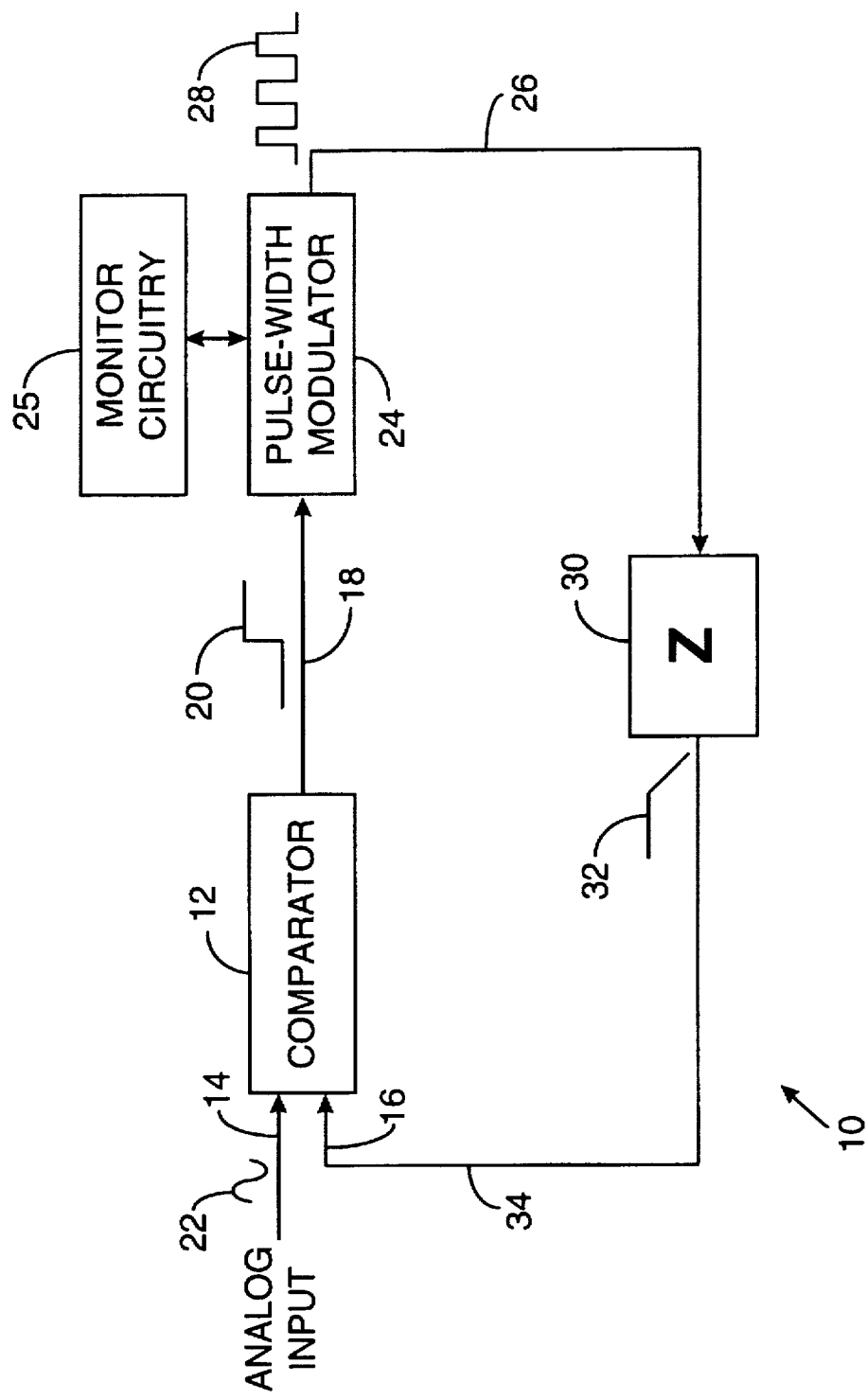
FIG. 1 is a schematic block diagram of the data conversion and processing system of the present invention.

FIG. 1 illustrates schematically the data conversion and processing system 10 of the present invention. The data conversion and processing system 10 comprises a comparator circuit ("COMPARATOR") 12, modulation circuitry 24, monitoring circuit 25 and a feedback filter 30 to achieve conversion of analog data signals into digital data signals and to achieve further processing of the digital data signals.

The comparator 12 receives an analog input signal 22 at a first input 14 which comprises the analog signal to be converted into an equivalent digital signal. The comparator 12 receives an analog feedback signal 32 at a second input 16 and produces a comparator output signal 20 at the comparator output 18. In the illustrated mode of operation, the comparator 12 produces a comparator output signal 20 which is responsive to the difference between the signals at inputs 14 and 16. The comparator 12 produces a logical one comparator output signal 20 when the analog input signal 22 at the first input 14 is greater than the analog feedback signal 32 at the second input 16. However, the comparator 12 produces a logical zero comparator output signal 20 when the analog input signal 22 at the first input 14 is less than or equal to the analog feedback signal 32 at the second input 16. In the embodiment illustrated, a logical one is +5 volts and a logical zero is 0 volts. However, in other embodiments these voltages will differ in accordance with system 10 operating voltages.

The comparator output signal 20 of the comparator feeds into modulation circuitry 24, in this case a "pulse-width modulator" 24 via line 18. The pulse-width modulator 24 produces a digital feedback signal 28 at its output. The digital feedback signal 28 comprises a pulse train that is a function of the logical value of the comparator output signal 20 received by the pulse-width modulator 24 as well as a function of previous values of the comparator output signal 20. The pulse-width modulator 24 produces the digital feedback signal 28 with pulses of longer duration, or width, in response to higher values of the analog input signal 22 and with pulses of shorter duration in response to lower values of the analog input signal 22. In the illustrated embodiment, the pulse-width modulator 24 is a fixed frequency pulse-width modulator in that the frequency of the pulses in the digital feedback signal 28 remains constant. Thus, the period, or time duration, between the rising edges of consecutive pulses of the digital feedback signal 28 is constant. However, in other embodiments, other types of pulsed system modulation could be employed, such as pulse duration modulation, pulse position modulation, pulse frequency modulation, or pulse coded modulation. In these other embodiments, the data modulator 24 would produce a digital output that was a function of the analog input signal 22 but that behaved differently than the digital feedback signal 28 described.

The digital feedback signal 28 of the pulse-width modulator 24 feeds into a feedback filter ("Z") 30 via line 26. The feedback filter 30 produces the analog feedback signal 32 in response to the digital feedback signal 28. The feedback filter 30 has a time constant which is large relative to the period of the digital feedback signal 28 produced by the pulse-width modulator 24. As the width of the pulses of the digital feedback signal 28 increases or decreases, the voltage level of the analog feedback signal 32 of the feedback filter 30 increases or decreases in response thereto. Thus, the magnitude of the analog feedback signal 32 produced by the feedback filter 30 is proportional to the width of the pulses of the digital feedback signal 28 produced by the pulse-width modulator 24.

The analog feedback signal 32 of the feedback filter 30 is fed into the second input 16 via line 34 to be compared with the analog input signal 22. When no analog input signal 22 is initially present at the first input 14 of the comparator 12, the voltage at that input is zero volts. In response thereto, the comparator 12 produces a comparator output signal 20 having a low logical voltage level, preferably zero volts.

The pulse-width modulator 24 receives the low voltage level comparator output signal 20 and produces an digital feedback signal 28 having narrow pulse widths. The narrow pulse width digital feedback signal 28 feeds into the feedback filter 30 which produces a low nonzero voltage analog feedback signal 32 in response therto. Because the pulse widths of the digital feedback signal 28 driving the feedback filter 30 are narrow, the average voltage of the digital feedback signal 28 is low therefore causing the analog feedback signal 32 of the feedback filter 30 to be a low nonzero voltage in response thereto.

The low nonzero voltage analog feedback signal 32 of the feedback filter 30 feeds into the second input 16 of the comparator 12 via line 34. Because the signal level at the first input 14 is not greater than the signal level at the second input 16, the output signal 20 produced by the comparator 12 remains at a low logical voltage value (e.g. zero volts) and the data conversion portion of the data conversion and processing system 10 remains in a quiescent state.

When the analog input signal 22 of the comparator 14 transitions to a nonzero instantaneous value, the analog input signal 22 at the first input 14 becomes greater than the analog feedback signal 32 at the second input 16. The comparator 12 produces a comparator output signal 20 having a high logical voltage value (e.g. five volts) in response to the compared signals at inputs 14 and 16. The pulse-width modulator 24 receives the high logical valued comparator output signal 20 and increases the width of the pulses of the digital feedback signal 28 in response to the high valued comparator output signal 20. The increasing pulse widths of the digital feedback signal 28 cause the average voltage value of the digital feedback signal 28 to correspondingly increase, thereby causing the magnitude of the analog feedback signal 32 of the feedback filter 30 to correspondingly increase in response thereto. The analog feedback signal 32 of the feedback filter 30 feeds into second input 16 and increases until it is equal to the instantaneous value of the analog input signal 22 at the first input 14.

When the level of the analog feedback signal 32 at second input 16 equals the level of the analog input signal 22 at the first input 14, the digital output signal 20 of the comparator 12 transitions from high to low, causing the width the pulses of the digital feedback signal 28 to decrease, thereby causing the analog feedback signal 32 to decrease. In the embodiment illustrated, the comparator 12 and pulse-width modulator 24 respond to changes in the value of the analog input signal 22 many times faster than the analog input signal 22 varies. Thus, as can be seen from the circuit arrangement of the data conversion and processing system 10, feeding the digital feedback signal 28 of the pulse-width modulator 24 back into the second input 16 of the comparator 12 through the feedback filter 30 causes the pulse-width modulator 24 to stabilize and lock onto the instantaneous value of the analog input signal 22 to be converted.

Monitoring circuitry 25 of the data conversion and processing system 10 monitors the pulse-width modulator 24 to determine the equivalent digital value of the analog input signal 22. Because the pulse-width modulation circuitry 24 varies the width of pulses of the digital feedback signal 28 based upon the magnitude of the analog input signal 22, the monitoring circuitry 25 determines the equivalent digital value of the analog input signal 22 based upon the width of the pulses of the digital feedback signal 28. In one application of the data conversion and processing system 10 of the present invention, the analog input signal 22 represents the voltage of a battery providing power to the system 10. Based upon the width of pulses of the digital feedback signal 28, the monitoring circuitry 25 may determine the voltage of the battery. In another application, the data conversion and processing system 10 receives an analog input signal 22 that represents voice communication. The monitoring circuitry 25 periodically receives a digital value representing the instantaneous value of the analog input signal 22. In a typical application wherein the bandwidth of voice communication extends to 8 kHz, the monitoring circuitry 25 samples the digital value at a rate of at least 16 kHz, thereby fully capturing the voice communication. However, in most applications, the sampling rate will be much higher to move sampling noise far beyond the upper end of the bandwidth of interest. Once data is captured, the monitoring circuitry 25 may operate upon the data as required or pass the data to another component in the system for further operation.

Figure 2:
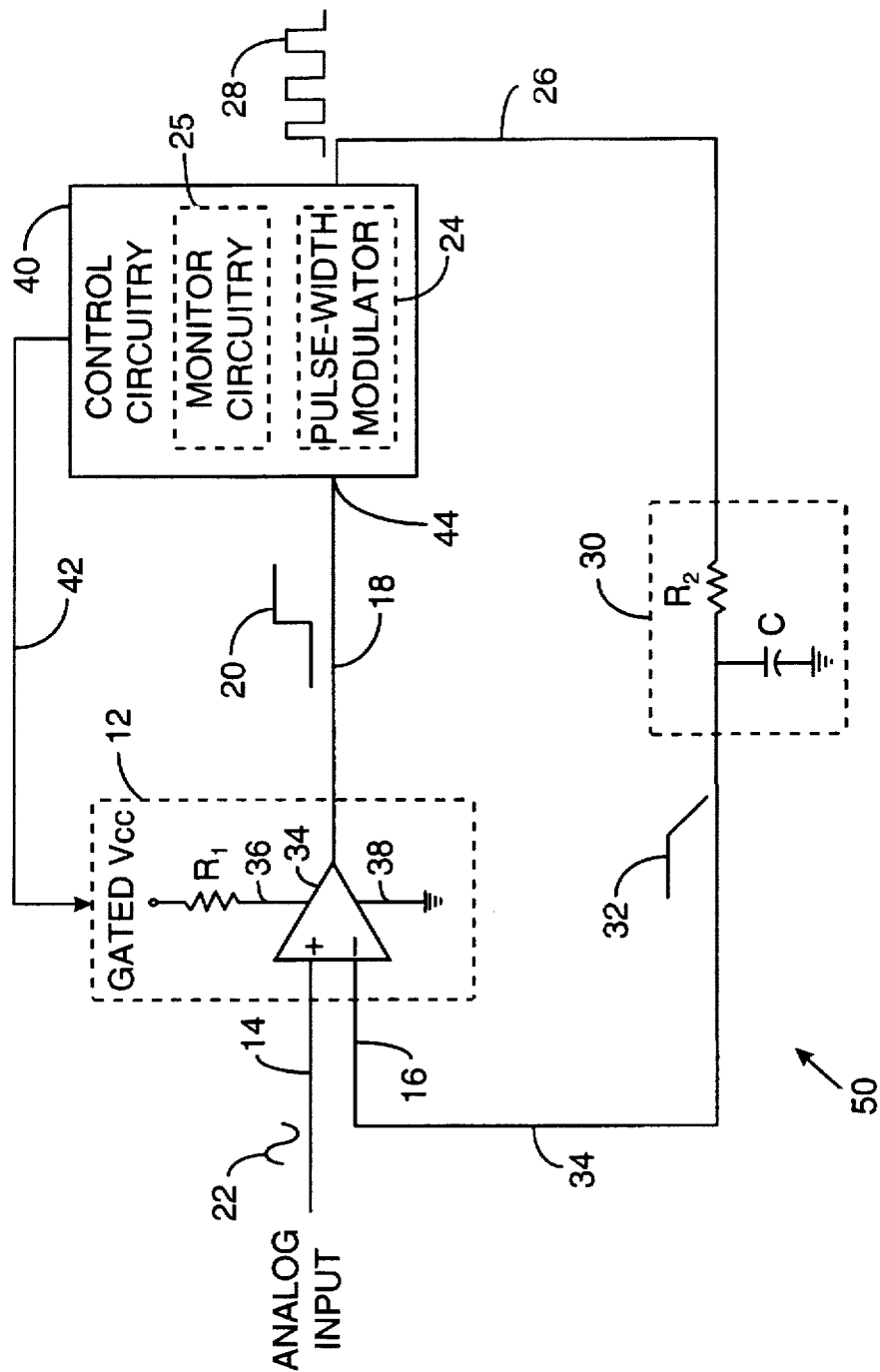
FIG. 2 is a schematic diagram of an alternate embodiment of the data conversion and processing system of the present invention wherein control circuitry performs pulse-width modulation and monitoring functions.

FIG. 2 is a schematic diagram illustrating an alternative data conversion and processing system 50 of the present invention. The system 50 comprises a comparator 12, control circuitry 40 and a feedback filter 30. Those components sharing common reference numerals with the components of FIG. 1 share common functionality. The control circuitry 40 performs the functions of both the pulse-width modulation circuitry 24 and the monitoring circuitry 25 of FIG. 1.

The comparator 12 comprises a high gain differential-input amplifier 34 that operates in a non-linear saturation mode. The output of the amplifier 34 approximates the output of an ideal comparator such that the output thereof instantaneously changes from a low output voltage to a high output voltage when the difference between the signals at its inputs 14 and 16 is sufficiently high. Thus, the output $V_{OUT}$ of amplifier 34 saturates when the difference between the input signals, the voltage at first input 14 ($V_{14}$) and second input 16 ($V_{16}$) is greater than the supply voltage ($V_{CC}$) divided by the voltage gain of the amplifier ($A_V$). This relation may be defined as:

| VOUT = V | (V14–V16) < VCC/AV |
|---|---|
| VOUT = VCC | (V14–V16) > VCC/AV |

The supply $V_{CC}$ defines the high logic voltage value and is therefore a fixed value. Therefore, in order to more closely approximate the characteristic behavior of an ideal comparator, the amplifier 34 operates at a relatively high voltage gain. Because the amplifier 34 functioning as a comparator is not intended to operate in the linear region, it may operate in the open loop gain mode (as shown in FIG. 2) for maximum gain and minimum circuit complexity without utilizing positive feedback. Alternatively, the amplifier 34 may utilize positive feedback to further increase the gain of the amplifier, however such an arrangement increases the complexity of the circuit in that the enablement of positive feedback must be selectively controlled to avoid latch-up, oscillation and instability.

The value of the supply, or rail, voltage $V_{CC}$ defines the high logical voltage output value of the comparator 12. The supply voltage $V_{CC}$ connects to the positive power supply terminal 36 through resister $R_1$ which limits the sinking current of the amplifier 34. The negative power supply terminal 38 of the amplifier 38 is grounded to define the low logical output value of the comparator 12. Note that the comparator's 12 connection to $V_{CC}$ is gated and controlled by the control circuitry 40 via line 42. In this fashion, the control circuitry 40 may disable operation of the comparator 12 to reduce power consumption when functionality of the comparator 12 is not needed. For example, with the data conversion and processing system 10 employed to monitor battery supply voltage, to convert analog voice data to digital voice data, to convert analog modem data to digital data or to convert other analog signals to digital signals, the system 10 may perform analog to digital conversion only during limited time periods. Thus, when not required, the control circuitry 40 disables the comparator 40 and also ceases generation of the digital feedback signal 28 by disabling the pulse-width modulator 24.

The comparator output signal 20 feeds into input 44 of the control circuitry 40. In the illustrated embodiment, the control circuitry 40 comprises a microcontroller ("µC)". However, in other embodiments, the control circuitry 40 could comprises a data processor, a digital signal processor or an application specific integrated circuit. The control circuitry 40 produces the digital feedback signal 28. When the pulse width of the digital feedback signal 28 is based upon the value of a register or memory location within the control circuitry 40, the resolution of the digital feedback signal 28 is limited by the width of data available for the control circuitry 40. For example, an 8 bit width allows for 256 different pulse widths of the digital feedback signal 28. Greater bit widths provide greater resolution in both pulse widths of the digital feedback signal 28 and resultantly, in measuring the value of the analog input signal 22. Control circuitry 40 may be chosen based in part upon the resolution required in measuring the analog input signal 22. Alternatively, multiple data widths could also be used to increase the resolution available.

The feedback filter 30 comprises a low pass, first order, passive RC circuit formed by series resister $R_2$ shunted by capacitor C. Alternatively, the feedback filter 30 may comprise an active feedback filter. The time constant of the feedback filter 30 is relatively much larger than the period of the digital feedback signal 28. Thus, any drift in the frequency of a clock signal clocking the control circuitry 40 has little or no effect on the accuracy of the analog-to-digital conversion process of the present invention. Further, the capacitance value, Q and the dielectric absorption of the capacitor C is not as critical as normally required with single slope analog-to-digital converters so long as the time constant of the feedback filter 30 is large with respect to the period of the pulse-width output signal 28.

The control circuitry 40 also includes the monitoring circuitry 25 employed to monitor operation of the pulse-width modulation 24 to determine a digital representation of the analog input signal 22. Because the pulse-width modulator 24 produces the digital feedback signal 28 with pulse widths proportional to the magnitude of the analog input signal 22, it maintains a value representing the magnitude of the analog input signal 22. The monitoring circuitry 25 extracts this value and operates on the value as required for further processing to extract an equivalent digital signal. This conversion process may require scaling, offsetting, filtering or otherwise converting the signal to produce the digital equivalent of the analog input signal 22 from the value received from the pulse width modulator 24.

In one embodiment, the control circuitry 40 operates upon digital voice data to filter the data, package the data and otherwise manipulate the data for further use. At each sample period, i.e. at a 16 kHz rate, the monitoring circuitry 25 extracts the instantaneous value representing the analog input signal 22 magnitude from the pulse-width modulator 24. Because the pulse-width modulator 24 operates at a much higher frequency than a highest frequency of interest of the analog input signal 22, the monitoring circuitry 25 accurately extracts digital samples of the analog input signal 22 from the pulse-width modulator 24. Thus, the data conversion and processing system 10 performs accurate signal conversion with reduced component requirements.

An "update cycle" is defined as the recurring cycle in which the pulse width of the digital feedback signal 28 may be adjusted. In one embodiment, the update cycle coincides with the low to high transition of the digital feedback signal 28. Thus, the frequency of the update cycle the frequency of the digital feedback signal 28. However, in other embodiments, the frequency of the update cycle may be less than the frequency of the digital feedback signal 28. In such embodiments, the pulse width of the digital feedback signal 28 remains constant between update cycles. At each update cycle, if the comparator output signal 20 is a logic 1, the width of subsequent pulses of the digital feedback signal 28 is increased by one pulse width increment. However, at each update cycle, if the comparator output signal 20 is a logic 0, the width of subsequent pulses of the digital feedback signal 28 is decreased by one pulse width increment. Between update cycles, the width of the pulses of the digital feedback signal 28 remains constant.

Figure 3:
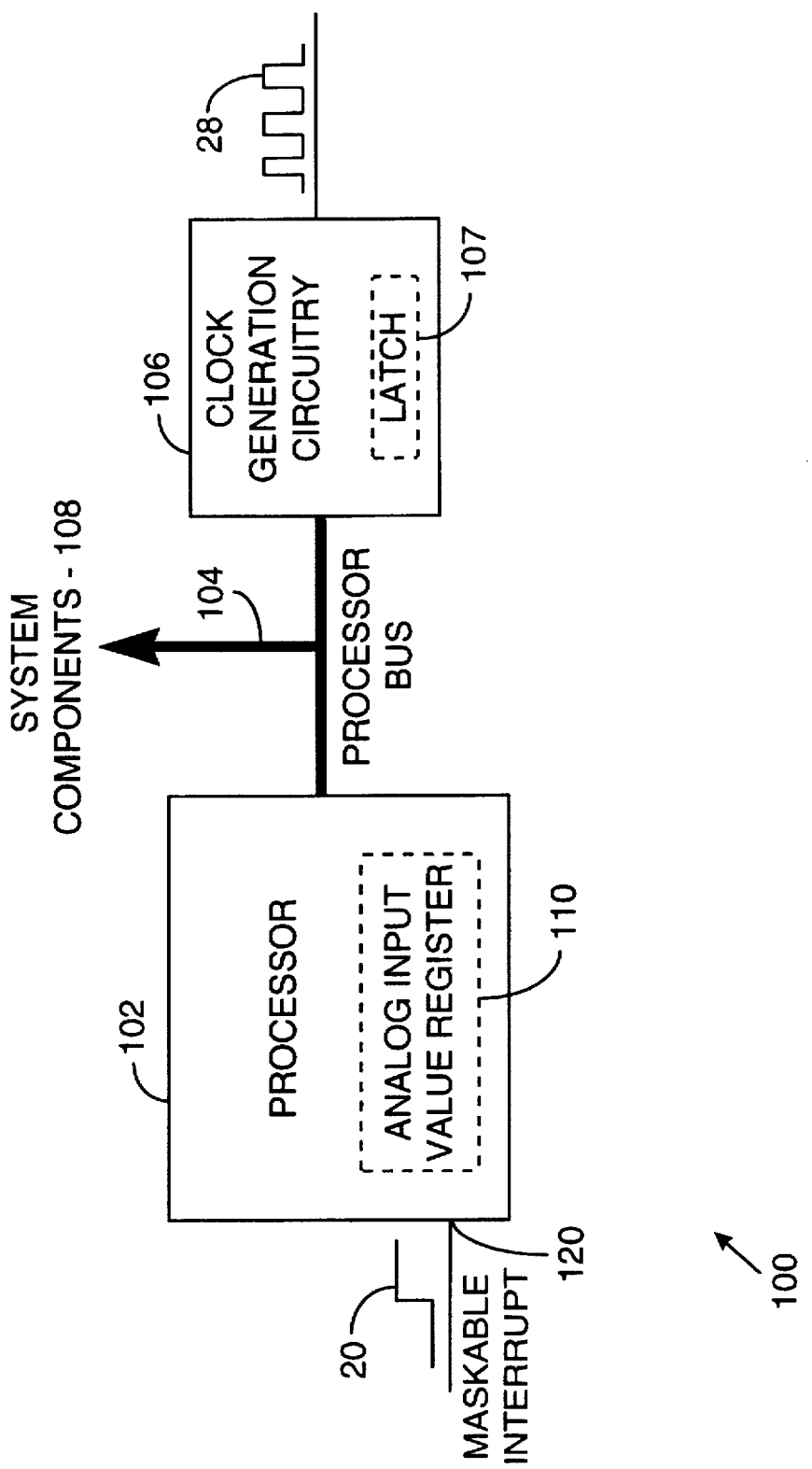
FIG. 3 is a schematic diagram illustrating a portion of a data conversion and processing system of the present invention wherein a the data modulation and data monitoring circuitry are implemented by the combination of a data processor and clock generation circuitry.

FIG. 3 illustrates a portion of a data conversion and processing system 100 wherein the pulse-width modulation 24 and monitoring circuitry 25 are implemented by the combination of a data processor 102 and clock generation circuitry 106. The processor 102 receives the comparator output 20 as a maskable interrupt at interrupt input 120, the interrupt sensitive to transitions. The processor 102 maintains an analog input value register 110 that contains a digital representation of the magnitude of the analog input signal 22. The analog input value register 110 is accessible by processes running on the processor 102 and by other system components 108 via an access across the processor bus 104.

At a transition of the comparator output signal 20, the processor 102 is interrupted and notified that the value of comparator output signal 20 has changed with respect to its prior value at interrupt input 120. The processor 102, having recorded the prior value of the comparator output signal 20 via a register, storage location or a flip-flop, therefore determine whether to increase or decrease the pulse width of the digital feedback signal 28 at the next update cycle.

The processor 102 monitors an internal clock or counter to determine at what points to initiate an update cycle. Of course, update cycles are initiated at a rate many times greater than the highest frequency of interest in the analog input signal 22. Thus, the analog input value register 110 stores an accurate representation of the analog input signal 22. Upon the initiation of an update cycle, the processor 102, based upon whether the maskable interrupt has been asserted at input 120, alters the value of the analog input value register 110. If, based upon the maskable interrupt, the processor 102 determines that the comparator output signal 20 is logic high, the processor 102 increments the value of the analog input value register 110 by one increment. If, based upon the maskable input state 42, the processor 102 determines that the comparator output signal 20 is logic low, the processor 102 decrements the value of the analog input value register 110 by one increment. The new value stored in the analog input value register 110 represents the most recent representation of the magnitude of the analog input signal 22. While the value contained in the analog input value register 110 represents the current value of the analog input signal 20, the value may require processing to produce an accurate digital equivalent of the current analog input signal 20, i.e. by scaling, filtering, offsetting or other function.

After updating the contents of the analog input value register 110, the processor 102 writes the value over the processor bus 104 to the clock generation circuit 106. The clock generation circuit 106 receives the value and generates the digital feedback signal 28 at the fixed frequency but at a duty cycle corresponding to the value written. In the embodiment illustrated, larger values of the contents of the analog input value register 110 correspond to greater duty cycles while smaller values of the contents of the analog input value register 110 correspond to smaller duty cycles. The value is stored in a latch 107 within the clock generation circuitry 106 and the clock generation circuitry 106 generates the digital feedback signal 28 based upon this value until the next update cycle. The processor 102 may also adjust the frequency of the clock generated by the clock generation circuitry 106 to reduce energy consumption of the circuit.

Figure 4:
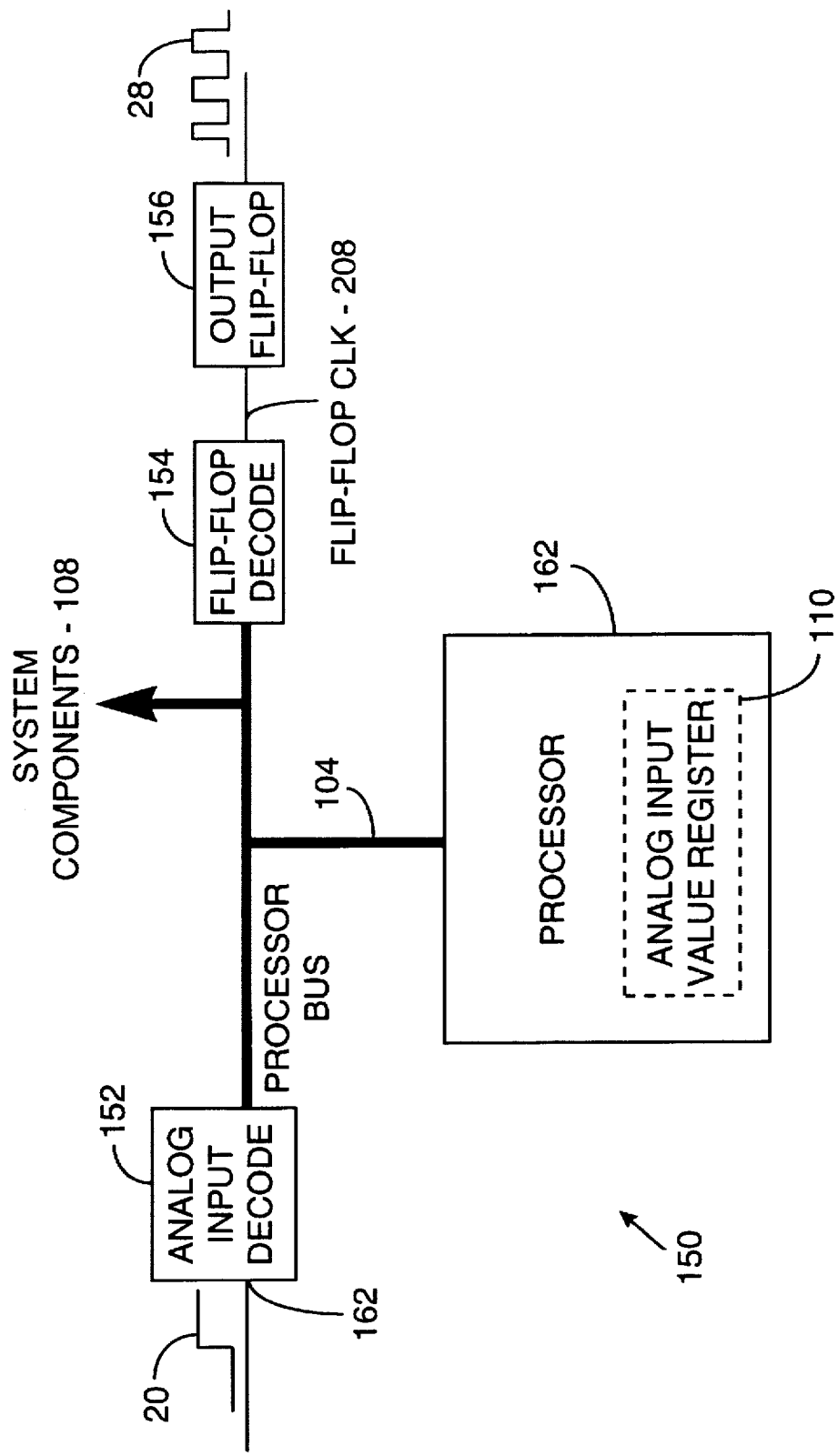
FIG. 4 is a schematic diagram illustrating a portion of a data conversion and processing system wherein the data modulation and data monitoring circuitry are implemented by the combination of a data processor, analog input decode circuitry, flip-flop decode circuitry and an output flip-flop.

FIG. 4 illustrates a portion of a data conversion and processing system 150 wherein the pulse-width modulator 24 and data monitoring circuitry 25 are implemented by the combination of a data processor 160, analog input decode circuitry 152, flip-flop decode circuitry 154 and an output flip-flop 156. Operation of the processor 160 is similar to operation of the processor 102 of FIG. 3 except that, with respect to FIG. 4, the comparator output signal 20 is received as an input to the analog input decode circuitry 152 at input 162 and retrieved by the processor 160 across the processor bus 104. At the initiation of an update cycle, the processor 160 accesses the analog input decode circuitry 152 by asserting a corresponding address on the processor bus 104. The analog input decode circuitry 152 decodes the address on the processor bus 104 and provides the value of the comparator output signal 20 to the processor 102 on a selected data line of the processor bus 104. The processor 160 reads the value provided and updates the contents of the analog input value register 110 accordingly.

Further, as compared to operation of the processor 102 of FIG. 3, the processor 160 generates each edge of the digital feedback signal 28 via the flip-flop decode circuitry 154 and output flip-flop 156. Based upon the frequency of digital feedback signal 28, the processor 160 generates each rising edge of the digital feedback signal 28. Further, based upon the value contained in the analog input value register 110, the processor generates each falling edge of the digital feedback signal 28. To generate either signal transition, the processor 160 addresses the flip-flop decode circuitry 154 by asserting a corresponding address on the processor bus 104. The flip-flop decode circuitry 154 receives the address, decodes the address and asserts a flip-flop clock signal 208 to the output flip-flop 156 thereby altering the output state of the output flip-flop 156. When the output of the output flip-flop 156 was previously logic low, addressing the flip-flop decode circuitry 154 generates a rising edge of the digital feedback signal 28. Alternatively, when the output of the output flip-flop 156 was previously logic high, addressing the flip-flop decode circuitry 154 generates a falling edge of the digital feedback signal 28.

The processor 160 addresses the flip-flop decode circuitry 154 to initiate a rising edge at expiration of a time-out period corresponding to the period of the digital output signal 28. Such time-out period may be generated by a counter internal to the processor 160 that is clocked by a processor clock signal. From assertion of a rising edge, the processor 160 again times out to assert a falling edge of the digital output signal 28. The time out period associated with asserting a falling edge is based upon the value contained in the analog input value register 110. Greater values of the analog input value register 110 correspond to larger values of the analog input signal 22 and also correspond to longer pulse widths of the digital feedback signal 28, thereby requiring greater duration of time between the assertion of a rising edge of the digital feedback signal 28 and the assertion of a falling edge of the digital feedback signal 28. As is apparent, the processor 160 may adjust the frequency of the digital feedback signal 28 by timing accesses of the flip-flop decode circuitry 154. Adjustment of this frequency may be performed to reduce energy consumption and also to adjust for other variations in the system 150.

In addition to the analog conversion functions executed, the processor 160 also performs data processing functions, control functions and the other functions required by a processor within a data processing system. Thus, by having the processor 160 provide functionality in the analog to digital conversion processes while also performing data processing functions, the cost of the data conversion and processing system is decreased.

Although a system and operation of such system according to the present invention has been described in connection with the described embodiments, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A data conversion and processing system comprising:
   a comparator having an first input that receives an analog input signal, a second input that receives an analog feedback signal and an output that produces a comparator output based upon the analog input signal and the feedback signal;
   modulation circuitry that receives the comparator output and produces a digital feedback signal based upon the comparator output;
   monitoring circuitry coupled to the modulation circuitry that produces a digital representation of the analog input signal; and
   feedback filter that receives the digital feedback signal and produces the analog feedback signal.

2. The data conversion and processing system of claim 1, wherein the monitoring circuit further comprises circuitry for data processing.

3. The data conversion and processing system of claim 2, wherein the circuitry for data processing comprises a microcontroller.

4. The data conversion and processing system of claim 1, wherein the modulation circuitry and monitoring circuitry comprise a processing unit.

5. The data conversion and processing system of claim 4, wherein:
   the processing unit receives the comparator output as an input;
   the processing unit produces the digital feedback signal as an output; and
   the processing unit calculates the digital representation of the analog input signal.

6. The data conversion and processing system of claim 4, wherein the processing unit receives the comparator output as an interrupt.

7. The data conversion and processing system of claim 4, wherein:
   the processing unit receives the comparator output as an interrupt;
   the processing unit produces the digital representation of the analog input signal; and
   the modulation circuitry further comprises a clock generator that receives the digital representation of the analog input signal and produces the digital feedback signal based upon the digital representation of the analog input signal.

8. The data conversion and processing system of claim 1, wherein the monitoring circuitry selectively disrupts power to the comparator.

9. The data conversion and processing system of claim 1, wherein the digital feedback signal comprises a pulse-width modulated signal having a duty cycle corresponding to a magnitude of the analog input signal.

10. A data conversion and processing system comprising:
    a comparator having an first input that receives an analog input signal, a second input that receives an analog feedback signal and an output that produces a comparator output based upon the analog input signal and the feedback signal;
    a data processor coupled to the comparator, the data processor comprising:
       modulation circuitry that receives the comparator output and produces a digital feedback signal based upon the comparator output; and
       monitoring circuitry that receives the comparator output and that produces a digital representation of the analog input signal based upon the comparator output; and
    feedback filter that receives the digital feedback signal and produces the analog feedback signal.

11. The data conversion and processing system of claim 10, wherein:
    the data processor receives the comparator output as an interrupt input;
    the data processor produces the digital feedback signal as data output; and
    the data processor calculates the digital representation of the analog input signal.

12. The data conversion and processing system of claim 10, wherein:
    the processing unit receives the comparator output as an interrupt;
    the processing unit produces the digital representation of the analog input signal as an output; and further comprising a clock generator that receives the digital representation of the analog input signal and produces the digital feedback signal based upon the digital representation of the analog input signal.

13. The data conversion and processing system of claim 10, wherein:

the data processor receives the comparator output as an interrupt;

the data processor calculates the digital representation of the analog input signal; and the data processor generates the digital feedback signal by generating rising edges and falling edges of the digital feedback signal.

14. The data conversion and processing system of claim 10, wherein the data processor selectively disrupts power to the comparator.

15. A data conversion and processing system comprising:

a comparator having an first input that receives an analog input signal, a second input that receives an analog feedback signal and an output that produces a comparator output based upon the analog input signal and the feedback signal;

modulation circuitry that receives the comparator output and produces a digital feedback signal based upon the comparator output;

monitoring circuitry that receives the comparator output and that produces a digital representation of the analog input signal based upon the digital feedback signal; and feedback filter that receives the digital feedback signal and produces the analog feedback signal.

16. The data conversion and processing system of claim 15, wherein the monitoring circuit further comprises circuitry for data processing.

17. The data conversion and processing system of claim 16, wherein the circuitry for data processing comprises a microcontroller.

18. The data conversion and processing system of claim 15, wherein the modulation circuitry and monitoring circuitry comprise a processing unit.

19. The data conversion and processing system of claim 18, wherein:

the processing unit receives the comparator output as an input;

the processing unit produces the digital feedback signal as an output; and the processing unit calculates the digital representation of the analog input signal.

20. The data conversion and processing system of claim 18, wherein:

the processing unit receives the comparator output as an interrupt;

the processing unit calculates the digital representation of the analog input signal; and the modulation circuitry further comprises a clock generator that receives the digital representation of the analog input signal and produces the digital feedback signal based upon the digital representation of the analog input signal.

* * * * *